(12) United States Patent
Takashima et al.

(10) Patent No.: US 6,369,580 B1
(45) Date of Patent: *Apr. 9, 2002

(54) ELECTRODE PATTERN INSPECTION DEVICE AND METHOD FOR DETECTING VOLTAGE VARIATION

(75) Inventors: Naoki Takashima, Higashiosaka; Tetsuya Kageyama, Nara, both of (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/488,696

(22) Filed: Jan. 20, 2000

(30) Foreign Application Priority Data

Jan. 21, 1999 (JP) ............................. 11-013507
Jan. 12, 2000 (JP) ......................... 2000-004038

(51) Int. Cl.$^7$ ..................... G01R 31/00; H01H 31/02; H01H 31/04

(52) U.S. Cl. ..................... 324/500; 324/537; 324/538; 324/539; 324/158.1

(58) Field of Search ............................... 324/500, 537, 324/538, 539, 158.1

(56) References Cited

U.S. PATENT DOCUMENTS

| | | | | |
|---|---|---|---|---|
| 3,792,383 A | * | 2/1974 | Knappenberger | 333/205 |
| 4,686,463 A | * | 8/1987 | Logan | 324/754 |
| 5,565,767 A | * | 10/1996 | Yoshimizu et al. | 324/158.1 |
| 5,723,906 A | * | 3/1998 | Rush | 257/723 |
| 5,736,863 A | * | 4/1998 | Liu | 324/765 |
| 5,962,867 A | * | 10/1999 | Liu | 257/48 |

FOREIGN PATENT DOCUMENTS

| | | | |
|---|---|---|---|
| JP | 2-230188 | | 9/1990 |
| JP | 02230188 | * | 9/1990 |
| JP | 404314032 | * | 4/1991 |
| JP | 405011000 | * | 1/1993 |
| JP | 5-333357 | | 12/1993 |
| JP | 05333357 | * | 12/1993 |
| JP | 09026452 | * | 6/1995 |
| JP | 09026461 | * | 6/1995 |
| JP | 407270476 | * | 6/1995 |

* cited by examiner

*Primary Examiner*—Safet Metjahic
*Assistant Examiner*—Wasseem H. Hamdan
(74) *Attorney, Agent, or Firm*—Edwards & Angell, LLP; David G. Conlin; Steven M. Jensen

(57) ABSTRACT

With DC constant current applied to an end of one of transparent electrodes by a constant current application terminal, a voltage is measured at an end of a transparent electrode adjacent to the foregoing electrode by a voltage detection terminal, while a common electrode is earthed by applying a brush earth terminal thereto in the vicinity of the foregoing transparent electrode. If the transparent electrode is broken, the DC constant current application circuit detects a voltage saturation state, whereas if the transparent electrode is short-circuited, the DC voltage detection circuit detects variation in the foregoing voltage. A short-circuiting/wire breakage memory circuit stores the detected irregularity of the voltage as defect information, and either wire breakage or short-circuiting is detected on the basis of the defect information. This provides an electrode pattern inspection device and method that ensures inspection of electrode patterns formed in a stripe form, whose ends on one side are connected with a common electrode, without being affected by, for example, a degree of precision in positioning of the electrode patterns.

10 Claims, 8 Drawing Sheets

F I G. 8 (a)
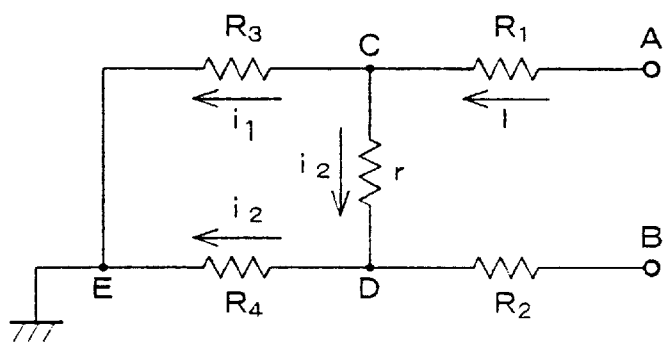
F I G. 8 (b)
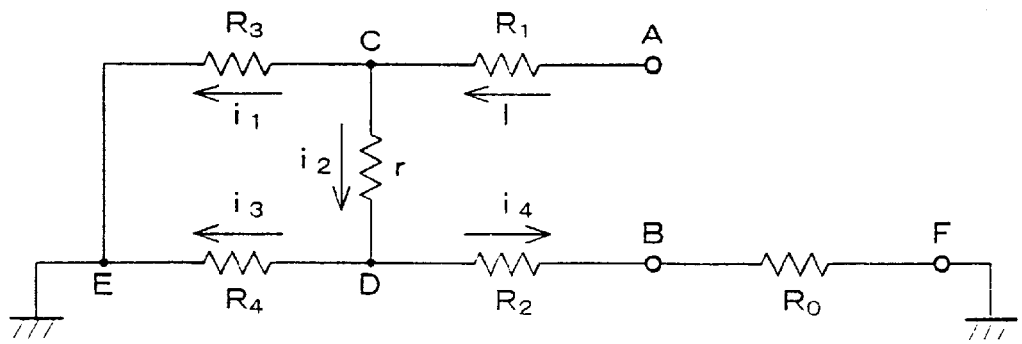

ELECTRODE PATTERN INSPECTION DEVICE AND METHOD FOR DETECTING VOLTAGE VARIATION

FIELD OF THE INVENTION

The present invention relates to a device and method for inspecting stripe electrode patterns formed on a substrate, so as to detect defects in the patterns.

BACKGROUND OF THE INVENTION

Conventionally, in a large-scale liquid crystal display element capable of displaying high-definition characters and images, a plurality of transparent electrodes are formed in a stripe form so that fine-pitched electrode patterns are provided on one of two transparent substrates in pair composing the liquid crystal display element.

In a process of fabrication of the transparent substrate with such transparent electrodes, used as a common technique to detect defects in the electrode patterns are $\hat{1}$ a method disclosed in the Japanese Publication for Laid-Open Patent Application No. 333357/1993 (Tokukaihei 5-333357 [Issue Date: Dec. 17, 1993]), and $\hat{2}$ a method disclosed in the Japanese Publication for Laid-Open Patent Application No. 230188/1990 (Tokukaihei 2-230188 [Issue Date: Sep. 12, 1990]).

In the case where the method $\hat{1}$ is adopted, used is an inspection device 101 provided with, as shown in FIG. 6, a first voltage inspection terminal 102, a voltage application terminal 103, a second voltage inspection terminal 104, an inspecting voltage application circuit 105, a defect detection circuit 106, and a short-circuiting/wire breakage memory circuit 107. The voltage application terminal 103 is connected with the inspection voltage application circuit 105, while the first and second voltage inspection terminals 102 and 104 are connected with the defect detection circuit 106. The defect detection circuit 106 is connected with the short-circuiting/wire breakage memory circuit 107, and is also earthed.

The plurality of transparent electrodes (electrode patterns) 121 in a stripe form are formed on the transparent substrate 120 as described above, and the voltage application terminal 103 is in contact with an end of one transparent electrode 121a thereamong, while the first voltage inspection terminal 102 is in contact with the other end of the transparent electrode 121a. Likewise, the second voltage inspection terminal 104 is in contact with an end of a transparent electrode 121b adjacent to the transparent electrode 121a, the end being on the first voltage inspection terminal 102 side. If the defect detection circuit 106 detects no conduction between the voltage application terminal 103 and the first voltage inspection terminal 102 upon application of a voltage by the inspection voltage application circuit 105, it follows that the transparent electrode 121a is broken. If the defect detection circuit 106 detects conduction between the voltage application terminal 103 and the second voltage inspection terminal 104, it follows that the transparent electrodes 121a and 121b are short-circuited. The foregoing defect information thus detected is outputted to and stored in the short-circuiting/wire breakage memory circuit 107.

By driving the three terminals, that is, the voltage application terminal 103 and the first and second voltage inspection terminals 102 and 104, in a direction crossing the transparent electrodes 121 in a stripe form so as to scan the transparent electrodes 121, all the transparent electrodes 121 on the transparent substrate 120 are subjected to inspection on presence/absence of wire breakage and short-circuiting.

On the other hand, in the case where the method $\hat{2}$ is adopted, used is a transparent substrate 122, as shown in FIG. 7, having a common electrode 124 formed at a peripheral part thereof outside to transparent electrodes (electrode patterns) 123 arranged in a stripe form and connected with every other transparent electrode 123. More specifically, the transparent substrate 122 used when the method $\hat{2}$ is applied is designed so that thereon alternately arranged are transparent electrodes 123a connected with the common electrode 124 and transparent electrodes 123b not connected therewith. Further, as shown in FIG. 7, an inspection device 110 used in this method is designed in the same manner as the inspection device 101 used in application of the method $\hat{1}$ except that not two voltage detection terminals, but a single voltage inspection terminal 108 is used alone.

The foregoing voltage application terminal 103 is brought into contact with the common electrode 124, while the voltage inspection terminal 108 is brought into contact with an end of one transparent electrode 123 and makes the contact scan in a direction crossing the transparent electrodes 123. In the case of one transparent electrode 123a not connected with the common electrode 124, without short-circuiting, a voltage is not detected from the voltage inspection terminal 108 by the defect detection circuit 106, whereas with short-circuiting, a voltage is detected. Conversely, in the case of one transparent electrode 123b connected with the common electrode 124, without wire breakage, a voltage is detected from the voltage inspection terminal 108 by the defect detection circuit 106, whereas with wire breakage, voltage is not detected.

Therefore, without any irregularity such as wire breakage or short-circuiting in the transparent electrodes 123, some transparent electrodes 123 at which a voltage is detected (voltage-detected transparent electrodes 123) and some transparent electrodes 123 at which a voltage is not detected (voltage-non-detected transparent electrodes 123) appear alternately (voltage is detected from the transparent electrodes 123b connected with the common electrode 124 while voltage is not detected from the transparent electrodes 123b not connected with the common electrode 124). With wire breakage or short-circuiting, however, voltage-detected transparent electrodes 123 or voltage-non-detected transparent electrodes 123 appear successively.

Therefore, such successive appearance of voltage-detected transparent electrodes 123 or voltage-non-detected transparent electrodes 123 is detected by the defect detection circuit 106 as a defect of wire breakage or short-circuiting, and it is, as defect information, outputted to and stored in the short-circuiting/wire breakage memory circuit 107.

The foregoing conventional methods have the following problems, however.

First of all, the transparent electrodes 121 subjected to an inspection by the method $\hat{1}$ have to be in a complete stripe form. The reason is as follows: since the voltage application terminal 103 and the first and second voltage inspection terminal 102 and 104 are in point contact with ends of the transparent electrodes 121, if the pitch of ends of the transparent electrodes 121 varies somewhere, an adequate electric circuit is not provided, thereby making inspection impossible.

Further, the method $\hat{1}$ requires high precision in positioning of the terminals and the plurality of transparent electrodes 121 disposed on the transparent substrate 120. In other words, unless the parallelized state of the terminals is set accurately and precisely, the terminals and the transparent electrodes 121 do not form an adequate electric circuit.

Likewise, unless the transparent electrodes 121 are disposed at precise and accurate positions on the transparent substrate 120, the parallel state of the terminals has to be set for each inspected transparent substrate 120 independently. To realize such high precision in positioning, a system for high-precision positioning system is needed, thereby bringing about an increase in costs.

Furthermore, the method 1̂ is incapable of inspection of electrode patterns designed so that an end of every transparent electrode 121 is connected with the above-described electrode 124. In other words, according to the method 1̂, the voltage application terminal 103 and the first voltage inspection terminal 102 are brought into contact with ends of one transparent electrode 121a on both sides, respectively, and the second voltage inspection terminal 104 is brought into contact with an adjacent transparent electrode 121b, but in the case where the common electrode 124 connected with every transparent electrode 121 is provided on the transparent substrate 120 (not illustrated), voltage is in the same manner applied onto the adjacent transparent electrodes 121a and 121b both via the common electrode 124, upon voltage application by the inspection voltage application circuit 105. Therefore, voltages with the same value are detected from the first and second voltage inspection terminals 102 and 104.

In this case, wire breakage can be detected from the transparent electrode 121a in contact with the voltage application terminal 103 and the first voltage inspection terminal 102, but detection of short-circuiting of the transparent electrode 121b in contact with the second voltage inspection terminal 104 is impossible, since the transparent electrode 121b is electrically connected, via the common electrode 124, with the transparent electrode 121a in contact with the first voltage inspection terminal 102.

Likewise, the method 2̂ is incapable of inspection of electrode patterns designed so that an end of every transparent electrode 121 is connected with the above-described electrode 124 (not illustrated). The method 2̂ is an electrode pattern inspection method applicable to electrode patterns formed in a stripe form and designed so that every other transparent electrode 123 is connected with the common electrode 124. Therefore, in the case of an electrode pattern inspection method in which an end of every transparent electrode 123 is connected with the common electrode 124, like in the foregoing method 1̂, detection of wire breakage is possible, whereas short-circuiting between adjacent transparent electrodes 123a and 123b is impossible since voltages with a similar value are detected from the adjacent transparent electrodes 123a and 123b.

SUMMARY OF THE INVENTION

An object of the present invention is to provide a device and method for surely inspecting electrode patterns arranged in a stripe form so that an end of every electrode pattern is connected with a common electrode, without being affected by the precision in positioning of the electrode patterns.

To achieve the foregoing object, an electrode pattern inspection device of the present invention is characterized by comprising (1) a current application section for applying constant electric current to an electrode to be inspected that is one of a plurality of electrodes having first ends connected with each other by a common electrode, and second ends opposite to the first ends, and for detecting variation in a voltage generated by the constant current, (2) a voltage detection section for measuring a voltage at an electrode adjacent to the electrode to be inspected, and detecting variation in the voltage, and (3) an earth section for earthing the common electrode.

The foregoing arrangement enables inspection to the electrode patterns arranged so that ends thereof on one side (first ends) are connected with each other by the common electrode, with regard to whether or not each electrode is broken and whether or not each electrode is short-circuited with an adjacent electrode.

Incidentally, in the case where by using a conventional electrode pattern inspection device each electrode is inspected with regard to whether or not it is short-circuited with an adjacent electrode, a voltage is applied to the inspected electrode, and a voltage at the electrode adjacent to the inspected electrode is measured. Then, in the case where the voltage of not zero volt is measured, it is judged that the electrodes are short-circuited.

However, by this method, a plurality of electrode patterns whose ends on one side are connected with each other by a common electrode cannot be inspected. This is because a voltage detected at an electrode adjacent to an inspected electrode is not zero also when the electrodes are not short-circuited, since each electrode is connected with an electrode adjacent thereto via the common electrode.

Conversely, in the foregoing arrangement of the present invention, since the common electrode is earthed by the earth section, the constant current applied to an inspected electrode by the current application section flows into the earth via the earth section, if the electrode pattern has no defect. Therefore, the constant current applied does not flow into an electrode adjacent thereto, and the voltage detected by the voltage detection section is zero. On the other hand, in the case where the electrode inspected is short-circuited with an electrode adjacent thereto, a voltage of not zero is detected by the foregoing voltage detection section. Thus, the use of the electrode pattern inspection device of the present invention enables detection of short-circuiting, which the conventional inspection device is incapable of.

In the case where the inspected electrode is broken, the resistance of the electrode becomes infinite. Therefore, it is possible to find the occurrence of such wire breakage from the voltage detected by the foregoing current application section.

The foregoing electrode pattern inspection device of the present invention is preferably arranged so that (1) the current application section has a current application terminal in contact with an end on the second side of the inspected electrode, (2) the voltage detection section has a voltage detection terminal in contact with the second end of the electrode adjacent to the electrode to be inspected, (3) the earth section has an earth terminal in contact with the common electrode, and (4) the current application terminal and the voltage detection terminal are shaped so as to be in point contact with the electrodes, respectively, while the earth terminal is shaped so as to be in area contact with the common electrode.

According to the foregoing arrangement, the current application terminal for applying constant current and the voltage detection terminal for measuring a voltage in a needle form (for example, in a probe form) so as to be brought into point contact with the transparent electrode. Therefore, each of these terminals is not brought into contact with a plurality of electrodes among the fine-pitched electrodes, thereby ensuring accurate inspection.

Furthermore, since the earth terminal is formed in a shape such that the earth terminal is in area contact with the common electrode and the area in which they are in contact is large, the inspection is surely carried out without being affected by precision in positioning the electrode patterns. In other words, when an electrode is shifted from a proper position, inspection can be accurately executed without use of a high-precision positioning device, since the earth terminal and common electrode are surely in contact with each other. Further, if the common electrode does not have a sufficient width, inspection is still possible. Therefore, restriction on the layout of the electrode patterns is minimized, thereby increasing the degree of freedom in layout.

Furthermore, since the area in which the earth terminal and the common electrode are brought into contact with each other is large, a contact resistance upon the scan by the earth terminal on the common electrode can be made to remain at a minimum degree. This provides speedier and more stable inspection.

To achieve the aforementioned object, an electrode pattern inspection method of the present invention is characterized by comprising the steps of (a) earthing a common electrode connecting ends on one side of a plurality of electrodes with each other, (b) applying constant current to an electrode to be inspected among the plurality of electrodes so as to detect variation in a voltage generated by the constant current, and (c) measuring a voltage at an electrode adjacent to the electrode to be inspected so as to detect variation in the voltage.

By the foregoing method, the common electrode is earthed, constant current is applied to an inspected electrode, and a voltage is measured at an electrode adjacent to the inspected electrode. In other words, by earthing the common electrode, the plurality of electrodes connected with each other via the common electrode can be electrically separated. Therefore, by measuring a voltage at an electrode adjacent to an inspected electrode upon application of current to the inspected electrode, whether or not the inspected electrode and the adjacent electrode are short-circuited can be inspected.

For a fuller understanding of the nature and advantages of the invention, reference should be made to the ensuing detailed description taken in conjunction with the accompanying drawings.

BRIEF DESCRIPTION OF THE DRAWINGS

FIGS. 5(a) and 5(b) are explanatory views illustrating states in which in the inspection device shown in FIG. 1, terminals are in contact with a transparent electrode and a common electrode, whereas

FIG. 8(a) is an explanatory view illustrating a state in which current flows through the equivalent circuit of the transparent electrodes shown in FIG. 3(b) in the case where the inside resistance of the DC voltage detection circuit is sufficiently great, and FIG. 8(b) is an explanatory view illustrating a state in which current flows through the equivalent circuit of the transparent electrodes shown in FIG. 3(b) in the case where the inside resistance of the DC voltage detection circuit is substantially equal to that of the transparent electrode.

DESCRIPTION OF THE PREFERRED EMBODIMENTS

[First Embodiment]

The following description will explain an embodiment of the present invention, while referring to FIGS. 1 through 5(a)–5(d). Note that the present invention is not particularly limited to this.

A device and method for electrode pattern inspection in accordance with the present invention is suitably adopted so as to, for example, detect wire breakage or short-circuiting in transparent electrodes in a stripe form provided on a transparent substrate used in a dot-matrix-display-type liquid crystal display element.

Figure 1:
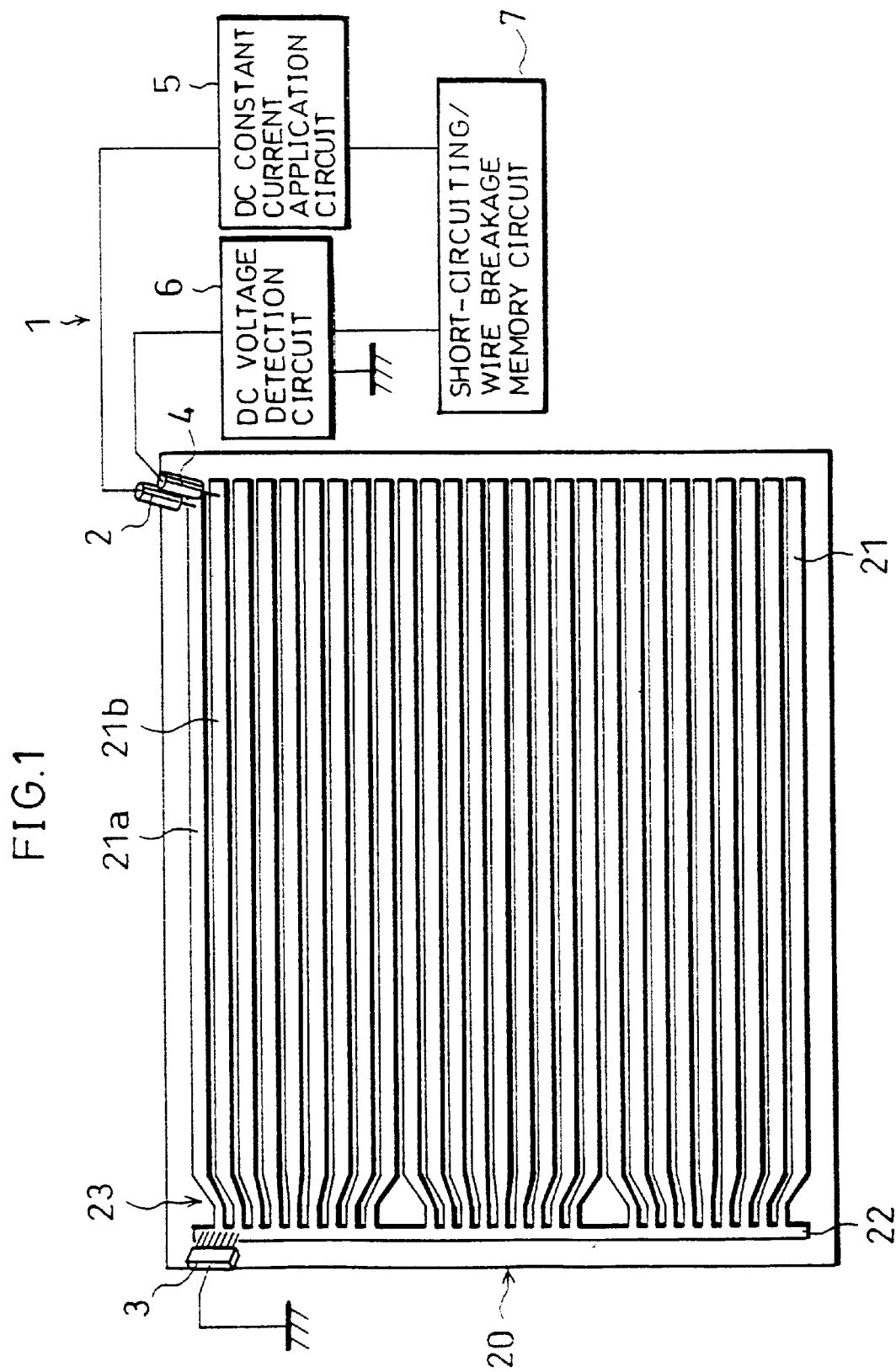
FIG. 1 is a schematic view illustrating an arrangement of an inspection device that performs an electrode pattern inspection method in accordance with one embodiment of the present invention.

As shown in FIG. 1, an inspection device 1 is provided with a constant current application terminal 2, a brush earth terminal (earth terminal) 3, a voltage detection terminal 4, a constant direct current application circuit (DC constant current application circuit, current application means) 5, a direct current (DC) voltage detection circuit (voltage detection means) 6, and a short-circuiting/wire breakage memory circuit (storing and identifying means, storing and identifying section) 7.

The foregoing constant current application terminal 2 is connected with the DC constant current application circuit 5. The brush earth terminal 3 is earthed. Further, the voltage detection terminal 4 is connected with the DC voltage detection circuit 6, while being earthed. The DC constant current application circuit 5 and the DC voltage detection circuit 6 are connected with the short-circuiting/wire breakage memory circuit 7.

A transparent substrate (substrate) 20 subjected to defect inspection by the foregoing inspection device 1 is, as shown in FIG. 1, provided with, on its surface, a plurality of transparent electrodes in a stripe form (electrode patterns, stripe electrodes) 21 with a width of, for example, 0.1 mm each at a constant pitch of, for example, 0.11 mm. On a periphery part beside the plurality of transparent electrodes 21, one common electrodes 22 is disposed in a direction crossing a lengthwise direction of the rectangular transparent electrodes 21, that is, in the arranging direction of the transparent electrodes 21.

The common electrode 22 functions as a short ring, which can prevents the transparent electrodes 21 from undergoing electrostatic noise. This provides obviation of defects due to static electricity and improvement of the yield, in manufacture of liquid crystal display devices. In FIG. 1, the common electrode 22 is rectangular in shape like the transparent electrodes 21, and is connected with an end of every transparent electrode 21. The common electrode 22, however, may have any shape as long as it functions as a short ring and does not adversely affect the electrode pattern inspection method in accordance with the present invention.

Connections for connecting the common electrode 22 with the transparent electrodes 21 are not particularly limited, but as an example of a connection structure applicable in the present embodiment, as shown in FIG. 1, the connections are extensions 23 connecting groups of the transparent electrodes 21 with the common electrode 22, each group being composed of nine transparent electrodes 21. In each extension 23, the widths of and spaces between the transparent electrodes 21 are narrowed.

The constant current application terminal 2 is in contact with an end of one transparent electrode 21 to be inspected, the end being on a side opposite to the common electrode 22 side (a side opposite to the extension 23 side), so that constant electric current supplied from the DC constant current application circuit 5 is applied to the transparent electrode 21. In FIG. 1, the transparent electrode 21 to be inspected is a transparent electrode 21a disposed at an outermost position of the transparent substrate 20, and the constant current application terminal 2 is in contact with a free end of tthe transparent electrode 21a. Note that an end of each transparent electrode 21 on a side opposite to the extension 23 side is referred to as free end in the following descriptions.

The voltage detection terminal 4 is in contact with a free end of a transparent electrode 21 adjacent (with a one-pitch space therebetween) to the transparent electrode in contact with the constant current application terminal 2, and detects presence/absence of a voltage at a level not lower than a predetermined level due to variation of resistance of the transparent electrode 21. In FIG. 1, the voltage detection terminal 4 is in contact with a transparent electrode 21b adjacent to the transparent electrode 21a.

The concrete structures of the constant current application terminal 2 and the voltage detection terminal 4 are not particularly limited, and terminals used in conventional electrode pattern inspection devices may be suitably applicable.

The brush earth terminal 3 is in contact with the common electrode 22, at a position in the vicinity of the transparent electrodes 21 to be inspected (in FIG. 1, the transparent electrode 21a), so as to absorb the DC constant current applied and let the same flow toward the earth, to prevent the applied DC constant current from flowing into an adjacent transparent electrode in the case where the transparent electrode 21 is neither broken nor short-circuited. The constant current application terminal 2 and the voltage detection terminal 4 are in point contact with the transparent electrodes 21, while the brush earth terminal 3 is, not in point contact, but in area contact with the common electrode 22.

The concrete structure of the brush earth terminal 3 is not particularly limited, and may be anything as long as it is made of a hair-like material having electric conductivity and unlikely damaging the common electrode 22. Incidentally, the shape of the earth terminal in contact with the common electrode 22 is not particularly limited, provided that it is capable of letting applied DC constant current flow away. However, a shape allowing the earth terminal to be in area contact with the common electrode 22, like the above-described brush earth terminal 3, is particularly preferable, to provide higher and more secure scan by the foregoing terminals, which will be described later.

The constant current application terminal 2, the brush earth terminal 3, and the voltage detection terminal 4 are driven by scanning means (scanning section) to scan the transparent electrodes 21 in the arranging direction of the transparent electrodes 21, that is, in the lengthwise direction of the common electrode 22, as will be described later. The structure of the scanning means for causing the three terminals to scan is not particularly limited, and scanning means using a driving motor to cause the three terminals to scan at a constant speed may be taken as an example.

The foregoing scanning means is particularly preferably designed to identify a position of the transparent electrodes 21 in contact with the foregoing three terminals (on the transparent substrate 20). For example, in the case where the scanning means is designed to use the foregoing driving motor, the driving motor may be designed to emit a signal. This facilitates to find to what extent the three terminals scan on the transparent substrate 20, thereby facilitating the identification of the position of the transparent electrodes 21 inspected.

The DC constant current application circuit 5 supplies the DC constant current to the constant current application terminal 2, and detects variation in a voltage generated by the supplied DC constant current. The DC voltage detection circuit 6 detects variation in a voltage with resistivity of the transparent electrode 21, using the DC constant current applied to the transparent electrode 21 that is measured by the voltage detection terminal 4. The short-circuiting/wire breakage memory circuit 7 stores the detected voltage variation as defect information, and detects wire breakage or short-circuiting occurring to the transparent electrode 21, based on the defect information.

As described above, the inspection device 1 of the present invention is provided with a current application section for applying constant current to an electrode to be inspected and detecting variation in the voltage in accordance with the foregoing constant current, a voltage measurement section for measuring a voltage at an electrode adjacent to the foregoing electrode to be inspected and detecting variation in the voltage, and an earth section for earthing the common electrode.

The foregoing current application section has the DC constant current application circuit 5, and the constant current application terminal (current application terminal) 2 in contact with a free end of the electrode to be inspected. The foregoing voltage measurement section has the DC voltage detection circuit 6, and the voltage detection terminal (voltage detection terminal) 4 in contact with a free end of an electrode adjacent to the foregoing electrode to be inspected. The foregoing earth section has a brush earth terminal (earth terminal) 3 in contact with the common electrode 22.

Thus, by earthing the common electrode 22 and measuring a voltage of an adjacent electrode upon application of constant current to the electrode to be inspected, whether or not an electrode to be inspected is broken and whether or not it is short-circuited with an electrode adjacent thereto can be inspected.

Subsequently, a method for detecting wire breakage and short-circuiting with use of the foregoing inspection device 1 (an electrode pattern inspection method in accordance with the present invention) will be explained. In the present invention, a voltage detection step for detecting variation in the voltage generated by application of a DC constant current is followed by an inspection step for inspecting whether or not the transparent electrode 21 undergoes wire breakage or short-circuiting based on the defect information obtained. Incidentally, the detecting method of the present invention may include other steps than the foregoing steps.

As described above, the constant current application terminal 2 is brought into contact with the free end of the transparent electrode 21a, the brush earth terminal 3, with the common electrode 22, and the voltage detection terminal 4, with a free end of the transparent electrode 21b adjacent thereto. DC constant current is applied to the constant current application terminal 2 from the constant current application circuit 5. In the present embodiment, for example, DC constant current of 0.5 mA is applied.

The foregoing DC constant current flows via the transparent electrode 21a to the brush earth terminal 3. Here, since the brush earth terminal 3 is earthed, the applied DC constant current is absorbed by the brush earth terminal 3 and escapes therefrom if the transparent electrodes 21a and 21b undergo no wire breakage or short-circuiting. Therefore, in the case where the transparent electrodes 21a and 21b have no defect, no voltage is detected by the voltage detection terminal 4.

Conversely, in the case where either the transparent electrode 21a or 21b undergoes wire breakage, the flow of the DC constant current is stopped at the broken portion, thereby making the resistances of the transparent electrodes 21a and 21b infinite. The DC constant current application circuit 5 attempts to raise the voltage according to the resistances, thereby producing a voltage saturation state. The DC constant current application circuit 5 detects the voltage saturation state as voltage variation, and outputs the same to the short-circuiting/wire breakage memory circuit 7.

Likewise, in the case where the transparent electrodes 21a and 21b are short-circuited, the DC constant current coming from the constant current application terminal 2 flows into the transparent electrode 21b from the transparent electrode 21a via the short-circuited portion. In other words, the DC constant current is divided and directed to the transparent electrodes 21a and 21b, reaching the brush earth terminal 3. As a result, the voltage detection terminal 4 measures a voltage corresponding to a resistance with respect to the foregoing DC constant current directed to the transparent electrode 21b, and the DC voltage detection circuit 6 detects a change in the voltage measured and outputs the same to the short-circuiting/wire breakage memory circuit 7. The process described so far is equivalent to the voltage detection step.

Then repeatedly carried out is the foregoing voltage detection, that is, detection of variation in a voltage by scanning the transparent electrodes 21 in the transparent electrodes 21 arrangement direction, that is, in a direction crossing the rectangular transparent electrodes 21 in a state in which the constant current application terminal 2, the brush earth terminal 3, and the voltage detection terminal 4 are in contact with the transparent electrodes 21.

Here, the foregoing three terminals are driven to scan by scanning means not shown that is capable of outputting as information the position of the three terminals on the transparent substrate 20. In other words, the scanning means is capable of outputting as information which ones of the transparent electrodes 21 on the transparent substrate 20 the three terminals are in contact with. By so doing, the position of the transparent electrodes 21 at which voltage variation is detected is outputted from the scanning means to the short-circuiting/wire breakage memory circuit 7.

The short-circuiting/wire breakage memory circuit 7 stores as defect information the voltage variation and the position of the transparent electrodes 21 at which the voltage variation is detected. Based on the defect information, wire breakage or short-circuiting occurring to the transparent electrodes 21 is detected, and the position of the transparent electrodes 21 on the transparent substrate 20 is identified as well. As a result, the transparent electrodes 21 with a defect can be easily identified.

Figure 2:
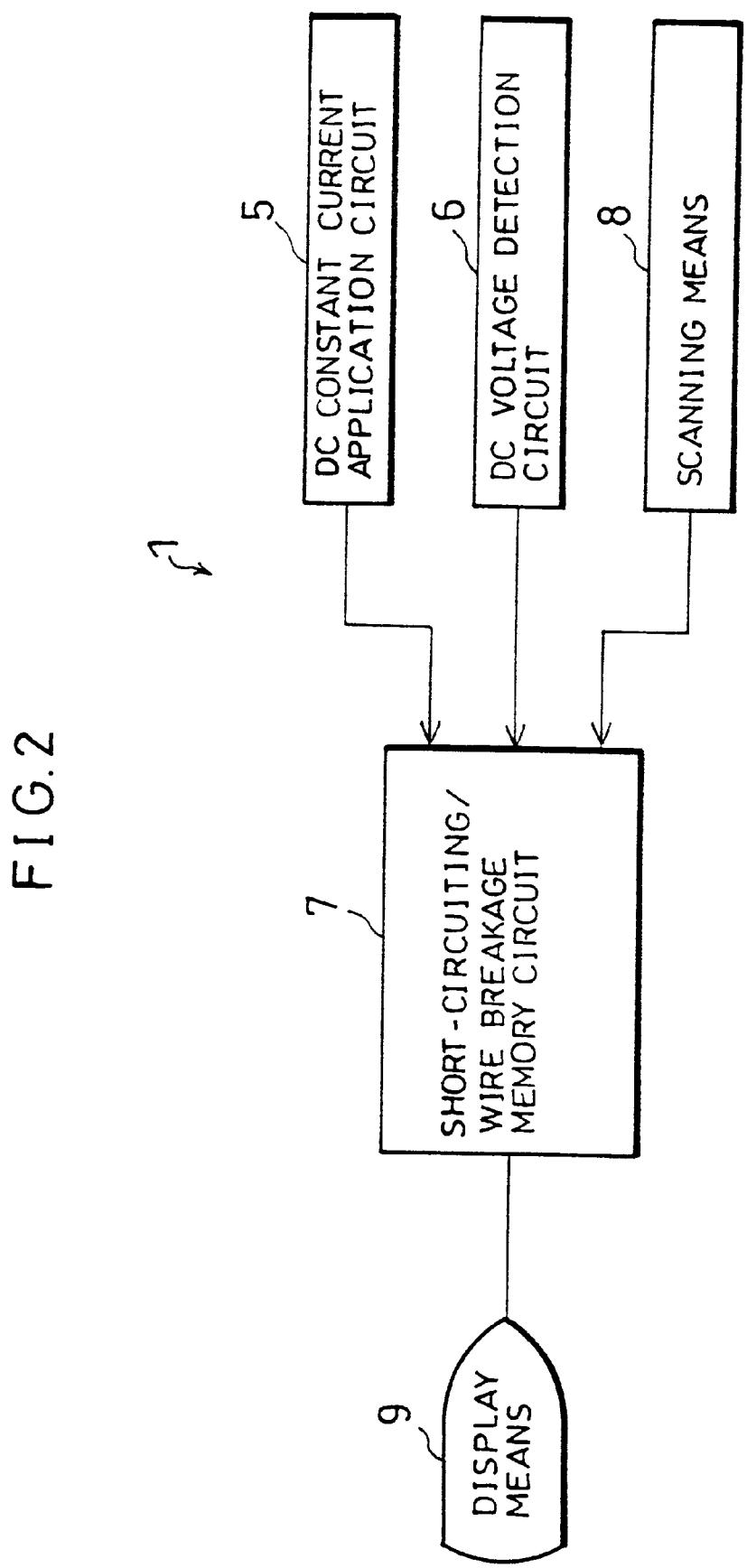
FIG. 2 is a block diagram illustrating an arrangement including an information transmitting route of the inspection device shown in FIG. 1.

The inspection device 1 in accordance with the present invention for carrying out the foregoing inspection method is designed, as shown in FIG. 2, so that information is outputted from the DC constant current application circuit 5, the DC voltage detection circuit 6, and the scanning means 8 to the short-circuiting/wire breakage memory circuit 7. In this case, voltage variation is outputted from the DC constant current application circuit 5 and the DC voltage detection circuit 6 as information, while the position of the three terminals, which is the position of the transparent electrodes 21 on the transparent substrate 20, is outputted as information from the scanning means 8.

The short-circuiting/wire breakage memory circuit 7 stores the foregoing information as defect information, and based on the defect information, identifies the transparent electrode 21 undergoing the wire breakage or the short-circuiting. Here, as shown in FIG. 2, the inspection device 1 is preferably provided with display means (display section) 9. The display means 9 is aimed to display the information about the transparent electrode 21 identified by the short-circuiting/wire breakage memory circuit 7, to inform the user of the same.

As the display means 9, concretely, a display device like a CRT display device or a liquid crystal display device, for example, is used. Besides, information to be displayed is not particularly limited, but examples of the same may include a state of voltage variation, a type of a defect detected (wire breakage, or short-circuiting), a concrete position of the transparent electrodes 21 at which the defect is detected. Thus informed of such information, the user is allowed to easily and surely grasp contents of the defect occurring to the transparent substrate 20.

The short-circuiting/wire breakage memory circuit 7 of the present embodiment is storing and identifying means which stores the foregoing defect information, as well as identifies the defect (identifies the type of the defect and identifies which transparent electrodes 21 undergo the defect) based on the defect information. In the present invention, however, the storage and the identification may be conducted by different means. In other words, storing means and identifying means may be independently provided, composed of different components, respectively.

The following description will explain the above-described detection of short-circuiting further in detail.

Figure 3A:
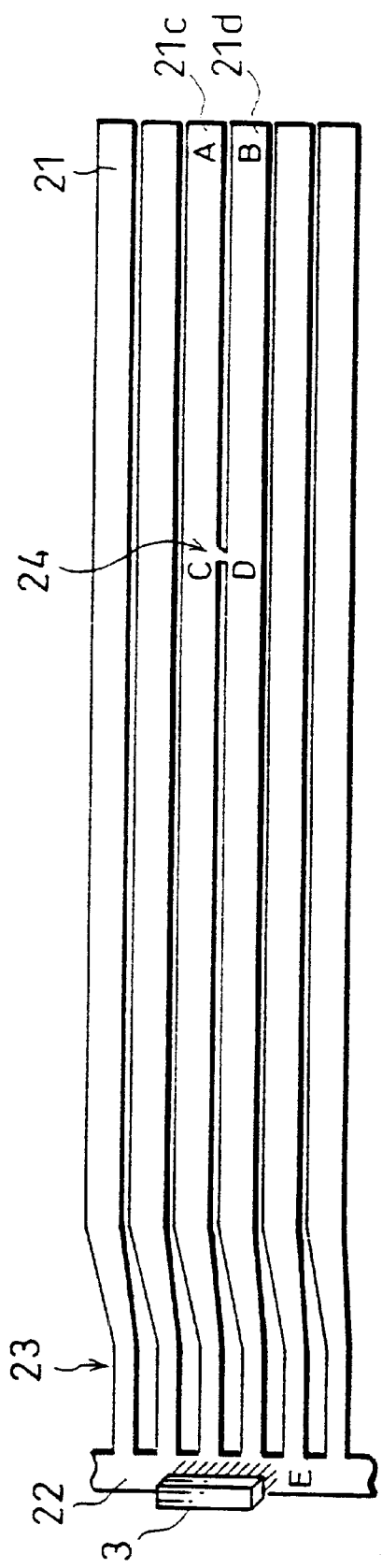
FIG. 3(a) is an explanatory view illustrating a state in which transparent electrodes are short-circuited on a transparent substrate that is inspected by the inspection device shown in FIG. 1.

As shown in FIG. 3(a), assume that the transparent electrodes 21c and 21d adjacent to each other, among the transparent electrodes 21 arranged in a stripe form, are short-circuited at a short-circuited portion 24.

The constant current application terminal 2 (not shown in FIG. 3(a)) is in point contact with a free end of the transparent electrode 21c, that is, at a position A thereof, whereas the voltage detection terminal 4 (not shown in FIG. 3(a)) is in point contact with a free end of the transparent electrode 21d, that is, at a position B thereof. Further, the brush earth terminal 3 is in area contact with the common electrode 22, at a position E thereof in the vicinity of the transparent electrodes 21c and 21d. Further, the short-circuited portion 24 is assumed to bridge from a position C in the transparent electrode 21c to a position D in the transparent electrode 21d.

Incidentally, FIG. 3(a) shows a case, as an example, where the short-circuited portion 24 is biased to the free end side rather than to the central part of the transparent electrodes 21c and 21d in a rectangular shape.

Upon application of DC constant current at the position A from the constant current application terminal 2 not shown in FIG. 3(a) in the inspection device 1 in accordance with the present embodiment, the foregoing DC constant current is divided and a part of the same flows from the transparent electrode 21c via the short-circuited portion 24 to the transparent electrode 21d. In FIG. 3(a), the DC constant current flows via two routes of A-C-E and A-C-D-E. Here, a voltage generated by the DC constant current with respect to a synthetic resistance of a resistance of the transparent electrode 21c from the position A to the position C, a resistance from the position C to the position D (the short-circuited portion 24), and a resistance of the transparent electrode 21c from the position C to the position E is measured by the voltage detection terminal 4.

Figure 3B:
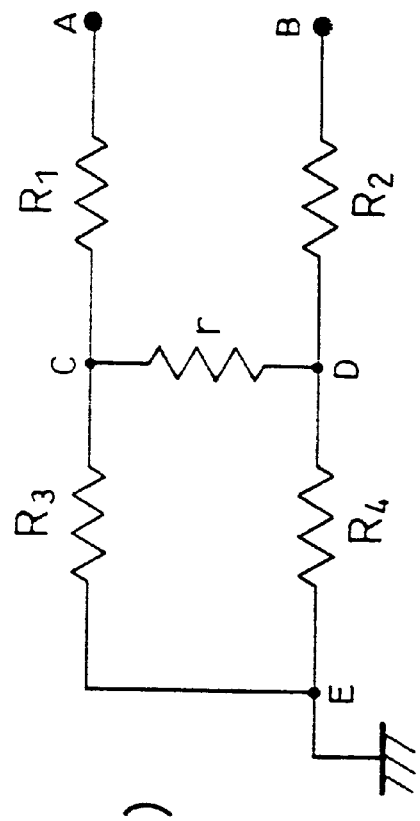
FIG. 3(b) is an equivalent circuit diagram of the short-circuited transparent electrodes shown in FIG. 3(a).

More specifically, the adjacent transparent electrodes 21c and 21d having the short-circuited portion 24 as shown in FIG. 3(a) are rewritten into an equivalent circuit diagram shown in FIG. 3(b) of a circuit composed of five resistors. In FIG. 3(b), let a resistance of the resistor of the transparent electrode 21c between the positions A and C and a resistance of the resistor thereof between the positions C and E in FIG. 3(a) be resistances $R_1$ and $R_3$, respectively, let a resistance of the resistor of the transparent electrode 21d between the positions B and D and a resistance of the resistor thereof between the positions D and E in FIG. 3(a) be the resistances $R_2$ and $R_4$, respectively, and let a resistance of the resistor between the positions C and D (the short-circuited portion 24) in FIG. 3(a) be the resistance r, then the transparent electrodes 21c and 21d are equivalent to a circuit arranged so that the resistor having the resistance r is provided to bridge from the resistors with resistances $R_1$ and $R_3$ between the positions A and E to the resistors having resistances $R_2$ and $R_4$ between the positions B and E.

In the inspection device 1 in accordance with the present embodiment, in the case where the transparent electrodes 21c and 21d are short-circuited at the short-circuited portion 24 thereby forming the circuit as shown in FIG. 3(b), no current flows through the DC voltage detection circuit 6, since a resistance inside the DC voltage detection circuit 6 is too great to allow the current to flow. Therefore, as described above, the DC constant current flows via the two routes of A-C-E and A-C-D-E shown in FIG. 3(a).

To explain this point more concretely, as shown in FIG. 8(a), let the DC constant current applied at the position A from the constant current application terminal 2 to the transparent electrode 21c be I, and the DC constant current I is divided at the short-circuited portion (position C) into two currents $i_1$ and $i_2$, the former flowing into the transparent electrode 21c thereby reaching the position E while the latter flowing via the short-circuit position and thereafter flowing into the transparent electrode 21d adjacent thereto. Here, since no current flows into the DC voltage detection circuit 6 connected to the position B via the voltage detection terminal 4, the current $i_2$ does not flow between the positions D and B, but flows between the positions D and E, finally reaching the brush earth terminal 3, which is earthed.

Thus, in the routes through which the DC constant current flows exist four resistors, namely, the resistor having the resistance $R_1$ corresponding to the portion of the transparent electrode 21c between the positions A and C, the resistor having the resistance r corresponding the short-circuited portion between the positions C and D, the resistor having the resistance $R_3$ corresponding to the portion of the transparent electrode 21c between the positions C and E, and the resistor having the resistance $R_4$ corresponding to the portion of the transparent electrode 21d between the positions D and E. Therefore, a voltage is determined depending on the synthetic resistance of these resistors and the DC constant current.

Here, with regard to the foregoing current $i_1$, current $i_2$, resistance $R_3$, resistance r, and resistance $R_4$, relationship expressed by the following formula is established, in which the current $i_2$ is expressed with resistances r, $R_3$, $R_4$, and current $i_1$.

$$R_3 \times i_1 = (r + R_4) \times i_2$$

From the foregoing formula, the following is derived:

$$i_2 = \{R_3/(r+R_4)\} \times i_1$$

Here, since $R_4 \approx R_3$, the following is obtained:

$$i_2 \approx \{R_3/(r+R_3)\} \times i_1$$

Further, since $I = i_1 + i_2$, the following relationship is established:

$$i_2 \approx \{R_3/(r+R_3)\} \times (I - i_2)$$

From the foregoing formula, the following formula (a) is derived:

$$i_2 \approx \{R_3/(r+2R_3)\} \times I \tag{a}$$

Since no current flows between the positions B and D as described above, no potential drop occurs to between the positions B and D. Therefore, the voltage V detected at the position B is equivalent to the potential at the position D, thereby establishing an equivalent circuit shown in FIG. 8(a). Therefore, it follows that $V = R_4 \times i_2 \approx R_3 \times i_2$. When this is substituted in the foregoing formula (a), the following formula (1) is finally derived:

$$V/R_3 \approx \{R_3/(r+2R_3)\} \times I$$

$$V = \{(R_3)^2/(r+2R_3)\} \times I \tag{1}$$

In other words, the voltage detection terminal 4 in contact at the position B measures the voltage V expressed by the foregoing formula (1) based on the synthetic resistance and DC current.

Incidentally, as shown in FIG. 1, since the DC voltage detection circuit 6 is earthed, the reference potential at the position B can be set equal to the reference potential of the transparent substrate 20 (the both reference potentials can be set to 0V). Accordingly, the measured value of the voltage V can be stabilized.

The voltage V expressed by the foregoing formula (1), measured by the voltage detection terminal 4, is amplified by an amplifier, not shown, and is recognized by the DC voltage detection circuit 6. The DC voltage detection circuit 6 detects voltage variation, upon transition from the 0V detecting state to the voltage V detecting state.

The voltage V expressed by the formula (1) is detected in the case where the short-circuited portion 24 exists, whereas the voltage V is not detected in the case of the normal transparent electrodes 21, which, without the short-circuited portion 24, does not form the circuit as shown in FIG. 3(b). Further, in the case where the transparent electrodes 21 undergo wire breakage, the voltage V is not detected since the circuit as shown in FIG. 3(b) is not formed, and besides, a voltage different from that in the case of the normal transparent electrodes 21 is detected (the voltage saturation state is detected). Therefore, to inspect the transparent electrodes 21 on the transparent substrate 20 having the common electrode 22, the normal state, the state of wire breakage, and the state of short-circuiting can be distinguished by detecting voltage variation, thereby resulting in that an inspection method easier and more accurate than in conventional cases is realized.

Incidentally, the synthetic resistance of the resistances $R_1$, r, $R_3$, and $R_4$ in FIG. 3(b) varies depending on the position of the short-circuited portion 24 between the transparent electrodes 21c and 21d, thereby causing the value of the foregoing voltage V to vary.

Further, from that the inside resistance $R_0$ of the DC voltage detection circuit 6 is set sufficiently great, it follows that the inside resistance $R_0$ is set great to an extent such that a ratio of the voltage V measured by the voltage detection terminal 4 with respect to the inside resistance $R_0$, that is, $V/R_0$, becomes substantially 0. In this case, a range of a numerical value of the inside resistance $R_0$ with respect to a numerical value of the foregoing voltage V is not particularly limited if the foregoing ratio $V/R_0$ is assumed to be substantially 0, viewing the applied current and the resistance of the transparent electrode 21. However, the inside resistance $R_0$ is preferably in a range of $10^6\Omega$ to $10^8\Omega$.

To explain steps constituting the foregoing electrode pattern inspection method of the present invention, first, a step (a) of earthing a common electrode connecting ends on one side of a plurality of electrodes with each other is carried out, followed by a step (b) in which constant current is applied to an inspected electrode among the plurality of electrodes so that variation in a voltage generated by the constant current is detected. Subsequently carried out is a step (c) in which a voltage at an electrode adjacent to the inspected electrode is measured so that variation in the voltage is detected.

Thereafter, in a step (d), a position of the inspected electrode in the plurality of electrodes is identified. Further, in a step (e), the variation in the voltages detected in the steps (b) and (c), and the position of the inspected electrode identified in the step (d) are stored, as well as a defect of the electrode is identified. Then, in a step (f), the position of the electrode stored in the step (e) and the defect of the electrode identified in the step (e) are displayed.

Figure 4A:
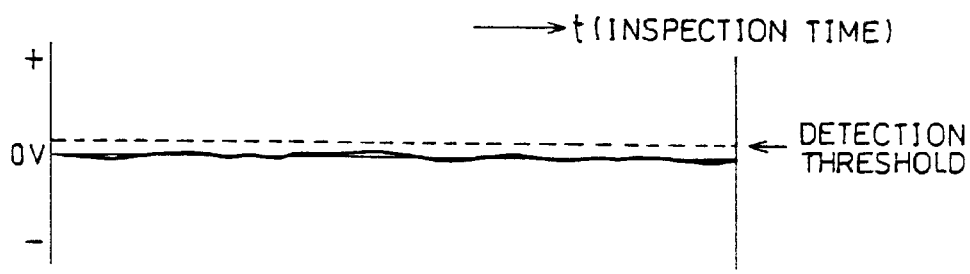
FIG. 4(a) is a graph of a waveform of a voltage detected by the inspection device shown in FIG. 1 in the case where the inspected transparent electrode has no defect.
Figure 4B:
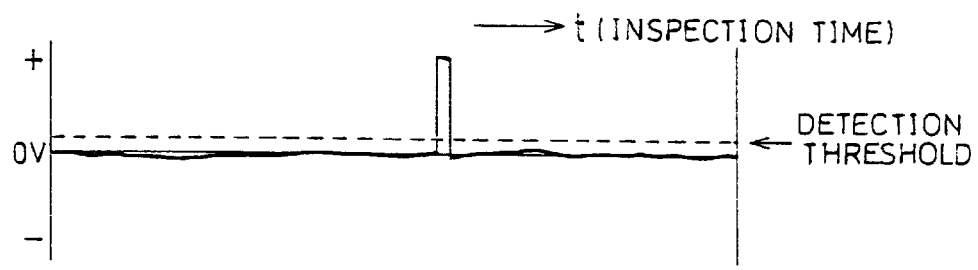
FIG. 4(b) is a graph of a waveform of a voltage detected in the case where the inspected transparent electrode is broken.
Figure 4C:
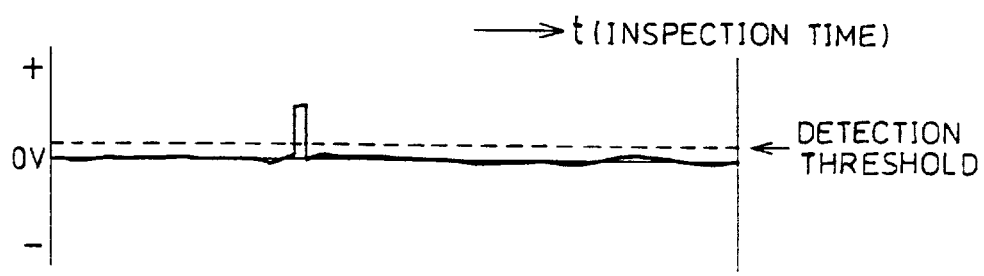
FIG. 4(c) is a graph of a waveform of a voltage detected in the case where the inspected transparent electrode is short-circuited.

The voltage variation detected by the inspection method in accordance with the present invention concretely take waveforms shown in graphs of FIGS. 4(a) through 4(c). In the graphs, a voltage detected is plotted as the ordinate, while an inspection time (a time in which the three terminals scan the transparent electrodes 21 on the transparent substrate 20) is plotted as the abscissa.

First of all, in the case where the transparent electrodes 21 are in a normal state, the DC constant current applied via the constant current application terminal 2 is allowed to escape through the brush earth terminal 3, and does not flow into an adjacent transparent electrode 21, as described above. Therefore, the voltage detected by the voltage detection terminal 4 is 0V. Thus, as shown in FIG. 4(a), the voltage detected takes a substantially linear waveform along a line indicative of 0V, showing substantially no change.

Incidentally, as shown in FIG. 4(a), even in the case of the normal transparent electrodes 21 to which the DC constant current is applied via the constant current application terminal 2, a voltage detected by the constant current application terminal 2 and the voltage detection terminal 4 more or less varies. Therefore, to distinguish the voltage variation due to wire breakage or short-circuiting from the foregoing unavoidable slight voltage variation, a detection threshold is set as denoted by a broken line in FIGS. 4(a) through 4(c). The detection threshold may be appropriately changed, depending on the arrangement of the transparent electrodes 21 and the applied DC constant current, and a concrete value of the detection threshold is not particularly limited.

In the case where a voltage exceeding the detection threshold is detected, the DC constant current application circuit 5 and the DC voltage detection circuit 6 recognize occurrence of wire breakage or short-circuiting, and send the voltage variation as information to the short-circuiting/wire breakage memory circuit 7.

Next, in the case where the transparent electrode 21 is broken, the DC constant current is stopped at the broken portion as described above, the resistance of the transparent electrode 21 becomes infinite. As a result, the voltage of the DC constant current application circuit 5 becomes saturated, and a pulse showing drastic excessiveness over the threshold appears in the waveform as shown in FIG. 4(b). The DC constant current application circuit 5 detects this as voltage variation, and sends this information to the short-circuiting/wire breakage memory circuit 7.

On the other hand, in the case where the transparent electrodes 21 are short-circuited at the short-circuited portion 24 as shown in FIG. 3(a), an electric circuit including the short-circuited portion 24 as shown in FIG. 3(b) is formed. Accordingly, the voltage detection terminal 4 detects a voltage V (see the formula (1)) according to a synthetic resistance obtained by synthesizing the resistances $R_1$, r, $R_3$, and $R_4$ and the DC constant current applied. Here again, a pulse showing drastic excessiveness over the threshold appears in the waveform as shown in FIG. 4(c). The DC voltage detection circuit 6 detects this as voltage variation, and sends the same to the short-circuiting/wire breakage memory circuit 7.

The constant current application terminal 2 and the voltage detection terminal 4 scan free ends of the transparent electrodes 21 at a predetermined speed, as the brush earth terminal 3 scans the common electrode 22 simultaneously. Therefore, the total lengths of the waveforms shown in FIGS. 4(a) through 4(c) correspond to the numbers of the transparent electrodes 21 that the terminals have scanned, that is, the total width of the transparent electrodes 21 that the terminals have scanned. In the case where the pulses are obtained in the waveforms as shown in FIGS. 4(b) and 4(c), accordingly, the widths of the pulses correspond to the numbers of the transparent electrodes 21 scanned by the terminals.

Therefore, in the case where, for example, several adjacent transparent electrodes 21 are broken, it is possible to find the same from the pulse widths. Such finding is also stored by the short-circuiting/wire breakage memory circuit 7 as information.

Here, in a conventional inspection device, the common electrode 22 and the terminal are in point contact with each other. In other words, the terminal and the common electrode 22 are in contact with each other in the same manner as in the case where the transparent electrodes 21 are in contact with the constant current application terminal 2 and the voltage detection terminal 4. on the other hand, in the case of the inspection device 1 of the present invention, the brush earth terminal 3 is in area contact with the common electrode 22, thereby having a larger contact area than in the conventional case.

If the common electrode 22 and free ends of the transparent electrodes 21 are brought into point contact with the terminals as in the conventional case, high-precision in positioning the terminals with respect to the transparent electrodes 21 is needed. More specifically, high precision is required in parallelization of respective scanning directions of the terminals with respect to the transparent substrate 20, arrangement of the transparent electrodes 21 provided on the transparent substrate 20, and the like.

Figure 5A:
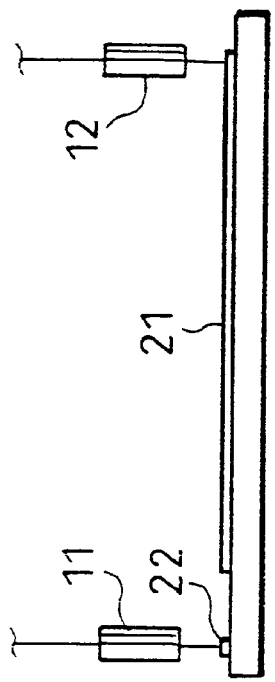
Figure 5B:
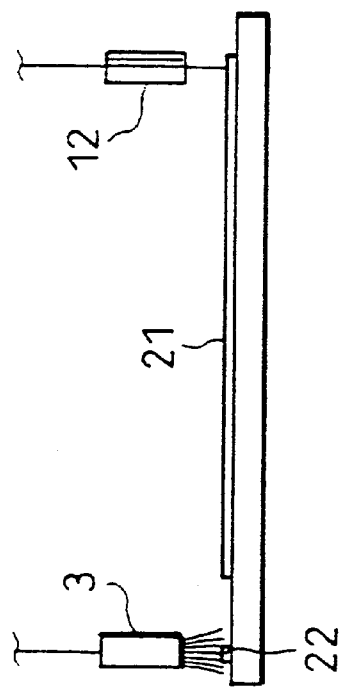
Figure 5C:
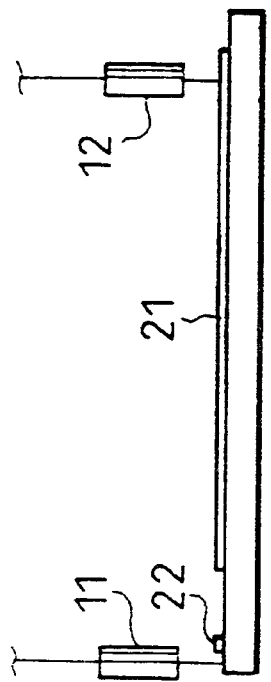
FIGS. 5(c) and 5(d) are explanatory views illustrating states in which in a conventional inspection device terminals are in contact with a transparent electrode and a common electrode.
Figure 5D:
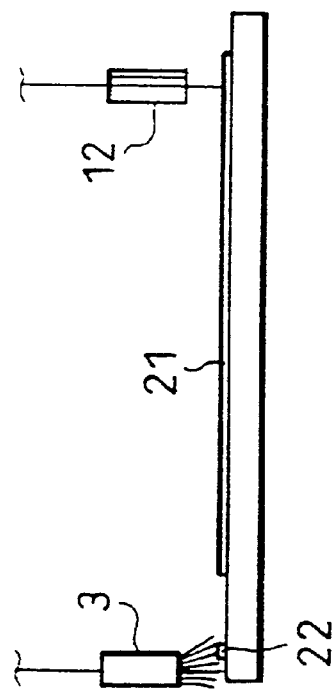
Figure 6:
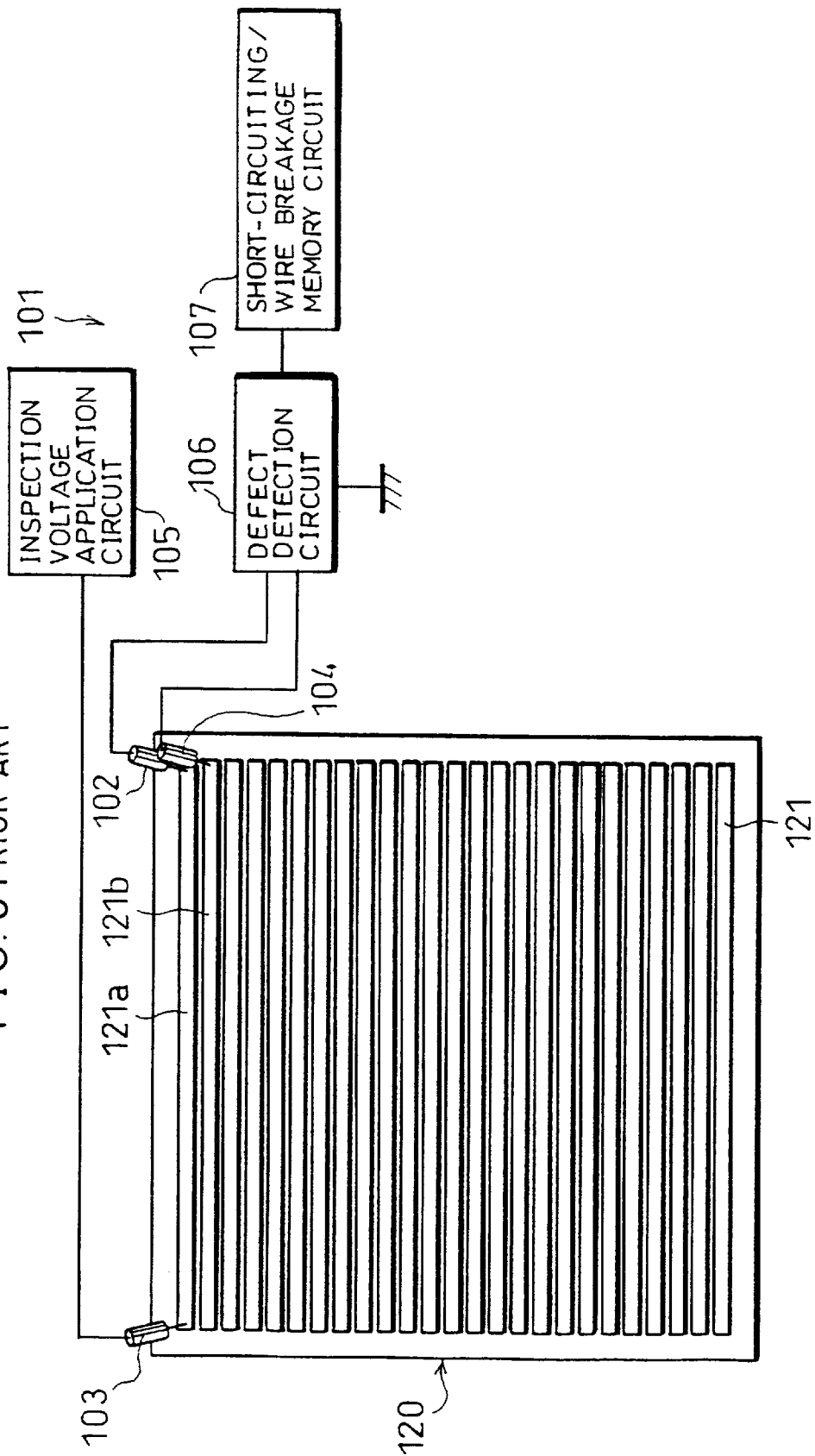
FIG. 6 is a schematic view illustrating an example of a conventional electrode pattern inspection device.
Figure 7:
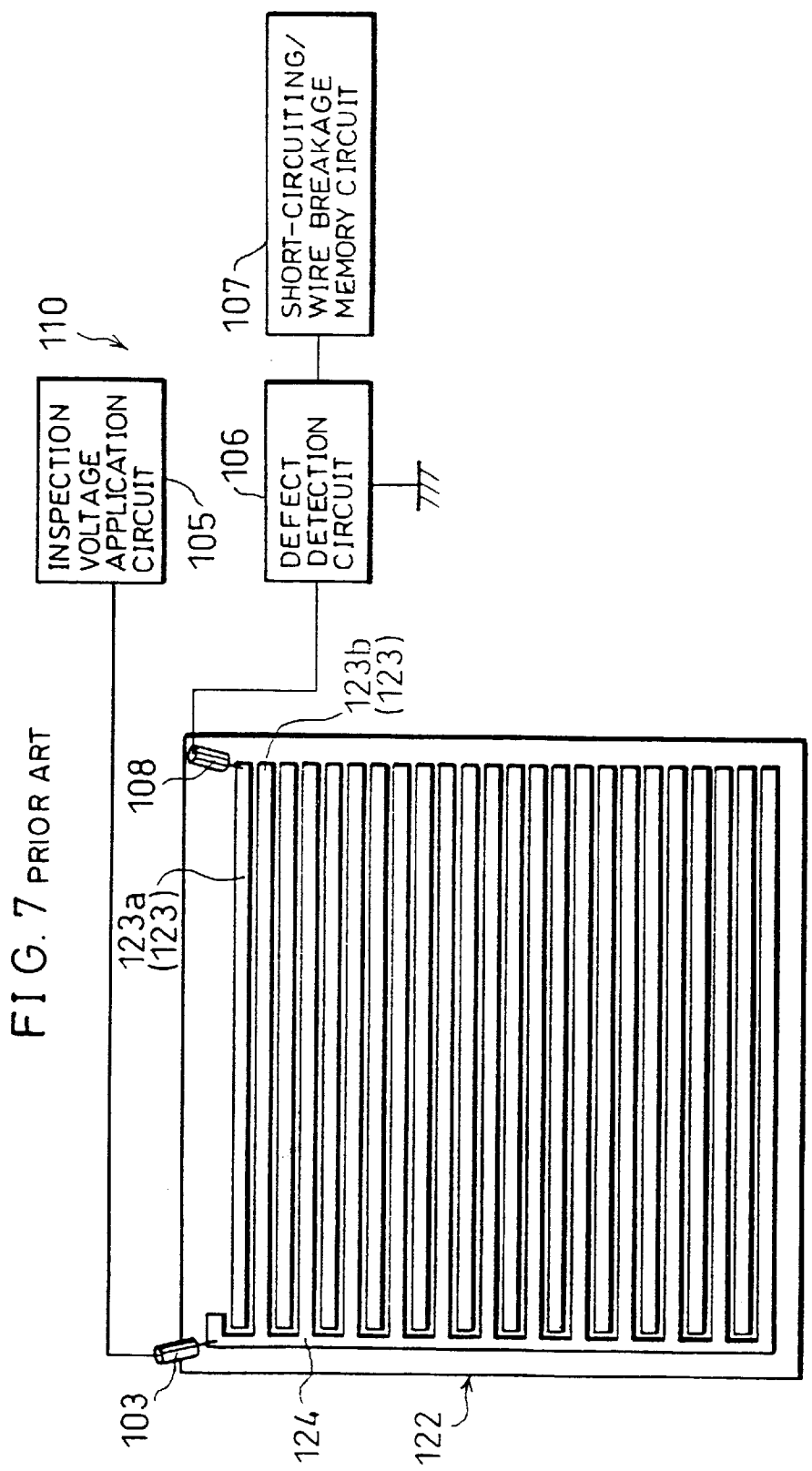
FIG. 7 is a schematic view illustrating another example of a conventional electrode pattern inspection device.

For example, as shown in FIG. 5(c), assume that a first terminal 11 and a second terminal 12 are in point contact with the common electrode 22 and a free end of one transparent electrode 21, respectively. Here, in the case where slight disorder occurs to the position relationship between the terminals 11 and 12, or to the positions of the transparent electrodes 21 provided, the second terminal 12 simply shifts on the transparent electrode 21 but the first terminal 11 deviates from the common electrode 22 due to the narrowness of the common electrode 22 thereby becoming out of contact with the common electrode 22, as shown in FIG. 5(d). This phenomenon becomes more remarkable in the case where the common electrode 22 cannot be made to have a sufficient width, due to the design of the transparent substrate 20.

Conversely, in the case of the inspection device 1 of the present invention, the first terminal 11 in contact with the common electrode 22 is the brush earth terminal 3 in a brush form. Therefore, as shown in FIG. 5(a), the second terminal 12 (the constant current application terminal 2 or the voltage detection terminal 4 in the present embodiment) is in point contact with a free end of one transparent electrode 21, while the brush earth terminal 3 is in area contact with the common electrode 22.

Consequently, even in the case where the slight disorder occurs to the position relationship between the brush earth terminal 3 and the second terminal 12, or to the positions of the transparent electrodes 21 provided, such slight disorder can be absorbed since the brush earth terminal 3 is in area contact with the common electrode 22, as shown in FIG. 5(b). Therefore, the brush earth terminal 3 is surely in contact with the common electrode 22, and the second terminal 12 is surely brought into contact with the free end of the transparent electrode 21.

Therefore, the inspection device 1 in accordance with the present invention is capable of executing inspection without strict positioning upon inspection, thereby not requiring a high-precision positioning device. Therefore, only applying pins or the like to edges of the transparent substrate 20 to fix the same to a certain position is required for execution of the inspection. Further, if the common electrode 22 on the transparent substrate 20 does not have a sufficient width, inspection is still possible. Therefore, restriction on the layout of the electrode patterns is minimized, thereby increasing the degree of freedom in layout.

Furthermore, since the area in which the brush earth terminal 3 and the common electrode 22 are brought into contact with each other is large, a contact resistance upon the scan by the brush earth terminal 3 on the common electrode 22 can be made to remain at a minimum degree. This provides more smooth scan by the three terminals, and hence, speedier and more stable inspection.

Furthermore, the earth terminal is not limited to the foregoing brush earth terminal 3, and it may have any arrangement as long as it is brought into area contact with the common electrode 22 and is capable of absorbing deviation if deviation occurs during scan.

Furthermore, the terminals other than the earth terminal (i.e., the constant current application terminal 2 and the voltage detection terminal 4) are extremely preferably, for example, in a needle form (probe form) so as to be brought into point contact with the transparent electrode 21. In the case where the terminals other than the earth are in a brush form, accurate inspection is impossible, since each of the terminals is likely brought into contact with a plurality of the transparent electrodes 21 arranged in a fine stripe form.

As has been described, an electrode pattern inspection method and device in accordance with the present invention is arranged so that three terminals are driven to scan free ends of a plurality of transparent electrodes whose ends on a side opposite to the free end side are connected with a common electrode, while simultaneously the common electrode is scanned so that a voltage is detected from a portion thereof adjacent to the inspected transparent electrode. This provides easy detection of wire breakage and short-circuiting occurring to the transparent electrodes.

Further, irrespective of a shape of the transparent electrode connected with an LSI (large-scale integration) element and a position of an extension thereof, inspection is enabled, further with respect to an LSI-connecting section. As a result, all the regions requiring inspection can be surely inspected.

Incidentally, in the present embodiment, the inspection for detecting defects of transparent electrodes provided on a transparent substrate used in a liquid crystal display element is taken as an example, but the present invention is not limited to this. The present invention may be applicable to a flat display substrate, a print circuit substrate, etc. having electrode patterns formed in stripe.

[Second Embodiment]

The following description will explain another embodiment of the present invention while referring to FIGS. 3(a), 3(b), and 8(b). Note that the present invention is not limited to this embodiment. The members having the same structure (function) as those in the first embodiment will be designated by the same reference numerals and their description will be omitted.

In the foregoing first embodiment, no current flows into the DC voltage detection circuit 6 since the inside resistance of the DC voltage detection circuit 6 is set great, and a potential at the position B shown in FIGS. 3(a) and 3(b) is measured. On the other hand, in the present embodiment, the inside resistance of the DC voltage detection circuit 6 is set so as to be substantially equal to the resistance of the transparent electrode 21, so that substantially the current flowing between the positions D and B is measured.

More specifically, like in the foregoing first embodiment, a short-circuited portion 24 (a portion C-D) lies between the adjacent transparent electrodes 21c (a portion A-C-E) and 21d (a portion B-D-E), and the constant current application terminal 2, the voltage detection terminal 4, and the brush earth terminal 3 are in contact with the positions A, B, and E, respectively, as shown in FIG. 3(a).

In the present embodiment, upon application of DC constant current to the position A from the constant current application terminal 2 of the inspection device 1, a part of the DC constant current is directed from the transparent electrode 21c via the short-circuited portion 24 so as to flow into to the transparent electrode 21d, and further, from the transparent electrode 21d to the voltage detection terminal 4 (DC voltage detection circuit 6).

In other words, the inspection device 1 of the present embodiment, as described above, in the case where an electric circuit as shown in FIG. 3(b) is formed with the transparent electrodes 21c and 21d short-circuited at the short-circuit position 24, current flows into the DC voltage detection circuit 6 since the inside resistance of the DC voltage detection circuit 6 is substantially equal to the transparent electrode 21. Therefore, DC constant current flows via three routes of A-C-E, A-C-D-E, and A-C-B.

To explain this point more concretely, as shown in FIG. 8(b), the DC constant current I applied at the position A from the constant current application terminal 2 to the transparent electrode 21c is divided at the short-circuited portion (position C) into two currents $i_1$ and $i_2$, the former flowing into the transparent electrode 21c thereby reaching the position E while the latter flowing via the short-circuit position and thereafter flowing into the transparent electrode 21d adjacent thereto. Here, since current flows into the DC voltage detection circuit 6 connected to the position B via the voltage detection terminal 4, the current $i_2$ is further divided into current $I_3$ flowing from the position D to the position E, and current $I_4$ flowing from the position D to the position B.

The current $i_3$ that flows between the positions D and E finally reaches the brush earth terminal 3, which is earthed. On the other hand, the current $i_4$ flowing between the positions D and B further flows through the DC voltage detection circuit 6, thereby flowing to the earth via the earth connected with the DC voltage detection circuit 6. Incidentally, let an inside resistance of the DC voltage detection circuit 6 be $R_0$, and a position at which the DC voltage detection circuit 6 is connected with the earth be a position F.

Thus, in the routes through which the DC constant current flows exist six resistors as shown in FIG. 8(b), namely, the resistor having a resistance $R_1$ that corresponds to the portion of the transparent electrode 21c between the positions A and C, the resistor having a resistance r that corresponds to the short-circuited portion between the positions C and D, the resistor having a resistance $R_2$ that corresponds to the portion of the transparent electrode 21d between the positions C and B, the resistor having a resistance $R_3$ that corresponds to the portion of the transparent electrode 21c between the positions C and E, the resistor having a resistance $R_4$ that corresponds to the portion of the transparent electrode 21d between the positions D and E, and the inside resistance $R_0$ of the DC voltage detection circuit 6. Therefore, a voltage is determined depending on the synthetic resistance of these resistances and the DC constant current.

Here, with regard to the foregoing current I, current $i_1$, current $i_2$, current $i_3$, and current $i_4$, relationship expressed by the following formula (b) is established:

$$I=i_1+i_2=i_1+i_3+i_4 \tag{b}$$

Further, regarding the foregoing current $i_1$, current $i_2$, and current $i_3$, and resistances of the foregoing resistances r, $R_3$, and $R_4$, relationship expressed by the following formula is established.

$$R_3 \times i_1 = r \times i_2 + R_4 \times i_3$$

Here, since the resistance r is much smaller than the resistances $R_3$ and $R_4$, and hence negligible, the following is derived:

$$R_3 \times i_1 \approx R_4 \times i_3$$

From the above formula, the following formula (c) in which $i_1$ is expressed with $R_3$, $R_4$, and $i_3$ is established:

$$i_1=(R_4/R_3)\times i_3 \tag{c}$$

Further, with regard to the current $i_3$, the current $i_4$, the resistance $R_4$, the resistance $R_2$, and the resistance $R_0$, relationship expressed by the following formula is established.

$$R_4 \times i_3=(R_2+R_0)\times i_4$$

From the foregoing formula, the following formula (d) in which $i_3$ is expressed with $R_4$, $R_2$, $R_0$, and $i_4$ is obtained:

$$i_3=\{(R_2+R_0)/R_4\}\times i_4 \tag{d}$$

Further, when the formulae (c) and (d) are substituted in the formula (b), the following is obtained:

$$\begin{aligned}
I &= i_1 + i_3 + i_4 \\
&= \{(R_4/R_3)\times i_3\} + i_3 + i_4 \\
&= \{(R_4/R_3)+1\}\times i_3 + i_4 \\
&= \{(R_4+R_3)/R_3\}\times\{(R_2+R_0)/R_4\}\times i_4 + i_4 \\
&= [\{(R_4+R_3)(R_2+R_0)+R_4R_3\}/R_3R_4]\times i_4
\end{aligned}$$

Here, since $R_1 \approx R_2$ and $R_3 \approx R_4$, the following is obtained:

$$\begin{aligned}
I &= \{2R_3(R_1+R_0)+R_3^2\}/R_3^2 \times i_4 \\
&= \{2(R_1+R_0)+R_3\}/R_3 \times i_4
\end{aligned}$$

From the above, the following formula (e) is derived:

$$i_4=\{R_3/(2R_1+2R_0+R_3)\}\times I \tag{e}$$

Further, since current flows between the positions D, B, and F, the voltage V measured is expressed as $V=R_0 \times i_4$. When this is substituted in the foregoing formula (e), the following formula (2) is finally obtained:

$$V=R_0\times\{(R_3/(2R_1+2R_0+R_3)\}\times I$$
$$V=\{R_0R_3/(2R_1+2R_0+R_3)\}\times I \tag{2}$$

In short, since the voltage detection terminal 4 in contact with the position B measures a voltage V expressed as the formula (2), which is determined by the resistances $R_1$ and $R_3$ in the transparent electrode 21c and the inside resistance $R_0$ in the DC voltage detection circuit 6.

The voltage V expressed by the foregoing formula (2), measured by the voltage detection terminal 4, is amplified by an amplifier, not shown, and is recognized by the DC voltage detection circuit 6. The DC voltage detection circuit 6 detects voltage variation, upon transition from the 0V detecting state to the voltage V detecting state.

The voltage V expressed by the formula (2) is detected in the case where the short-circuited portion 24 exists, whereas the voltage V is not detected in the case of the normal transparent electrodes 21, which, without the short-circuited portion 24, does not form the circuit as shown in FIG. 8(b). Further, in the case where the transparent electrodes 21 undergo wire breakage, the voltage V is not detected since the circuit as shown in FIG. 8(b) is not formed, and besides, a voltage different from that in the case of the normal transparent electrodes 21 is detected (the voltage saturation state is detected). Therefore, to inspect the transparent electrodes 21 on the transparent substrate 20 having the common electrode 22, the normal state, the state of wire breakage, and the state of short-circuiting can be distinguished by detecting voltage variation, thereby resulting in that an inspection method easier and more accurate than in conventional cases is realized.

Incidentally, the resistances $R_1$ and $R_3$ in FIG. 8(b) vary depending on the position of the short-circuited portion 24 between the transparent electrodes 21c and 21d, thereby causing the value of the foregoing voltage V to vary.

Further, since the inside resistance $R_0$ of the DC voltage detection circuit 6 is in a range of several ohms to several hundreds of ohms ($10^0$ to $10^2\Omega$) (in a substantially equal range to that of the resistance of the transparent electrode 21), the detection device 1 in accordance with the present embodiment virtually detects the current $i_4$ flowing between the positions D, B, and F in FIG. 8(b), from the voltage V measured by the voltage detection terminal 4.

Therefore, the expression of "detection of (variation in) a voltage" and the arrangement of "voltage detection means (DC voltage detection circuit 6 )" as described above with regard to the present embodiment appear to be preferably expressed as "detection of current" and arranged as "DC current detection circuit 6". However, since the arrangement of the inspection device 1 of the present embodiment is substantially the same as that of the inspection device 1 of the first embodiment except the inside resistance $R_0$, the foregoing expression and arrangement are made to agree with those of the first embodiment, for conveniences' sake.

As described above, in the electrode pattern inspection method and device in accordance with the present invention, if the electrode pattern is in a normal state, the DC constant current supplied by the current application means flows from the constant current application terminal along the electrode pattern, and thereafter becomes absorbed by the earth terminal via the common electrode and let to go therefrom. Therefore, the current does not flow into the voltage detection terminal in contact with the adjacent electrode pattern, and hence, the voltage detection terminal does not detect a voltage.

In the case where an electrode pattern is broken, the DC constant current is stopped at the broken portion, and the electrode pattern has an infinite resistance. In response to this, the current application means raises the voltage so as to supply current according to the resistance, thereby causing the voltage to become in a saturated state.

On the other hand, in the case where an electrode pattern is short-circuited with an adjacent electrode pattern, all the DC constant current does not reach the earth terminal, but a part of the same flows into the adjacent electrode pattern via the short-circuited portion, reaching the voltage detection terminal. This results in that the voltage detection terminal in contact with the adjacent electrode pattern measures a voltage according to the inside resistance in the electrode pattern and the voltage detection circuit.

In other words, in the present embodiment, the inside resistance of the foregoing voltage detection means is set substantially equal to the resistance of the electrode pattern. For this reason, the current flows from the position at which the electrode patterns are short-circuited to the voltage detection means, which detects a voltage in this stage. Therefore, the voltage detection means virtually detects current flowing from the short-circuited position to the voltage detection means. As a result, unlike in the first embodiment, the short-circuiting is surely detected as variation in the current.

The invention being thus described, it will be obvious that the same may be varied in many ways. Such changes are not to be regarded as a departure from the spirit and scope of the invention, and all such modifications as would be obvious to one skilled in the art are intended within the scope of the following claims.

What is claimed is:

1. An electrode pattern inspection device, comprising:

a current application section for applying constant electric current to an electrode to be inspected that is one of a plurality of electrodes having first ends connected with each other by a common electrode, and second ends opposite to the first ends, and for detecting voltage variation in connection with said electrode where the constant electric current is applied;

a voltage detection section for measuring a voltage at an electrode adjacent to said electrode to be inspected, and detecting variation in the voltage; and an earth section for earthing said common electrode, thereby grounding the first ends of said plurality of electrodes, said earth section being shaped so as to be in area contact with said common electrode.

2. The electrode pattern inspection device as set forth in claim 1, wherein:

said current application section has a current application terminal in contact with the second end of said electrode to be inspected;

said voltage detection section has a voltage detection terminal in contact with the second end of said electrode adjacent to said electrode to be inspected; and said earth section has an earth terminal in contact with said common electrode, said electrode pattern inspection device further comprising:

a scanning section for driving said current application terminal, voltage detection terminal, and earth terminal to scan said plurality of electrodes, and identifying a position of an inspected electrode in said plurality of electrodes.

3. The electrode pattern inspection device as set forth in claim 2, further comprising:

a storing and identifying section for storing the respective variation in the voltages detected by said current application section and voltage detection section, and a position of said inspected electrode identified by said scanning section, and for identifying a defect of said electrode; and a display section for displaying the position of said electrode stored by said storing and identifying section, and the defect of said electrode identified by said storing and identifying section.

4. The electrode pattern inspection device as set forth in claim 1, wherein:

said current application section has a current application terminal in contact with the second end of said electrode to be inspected;

said voltage detection section has a voltage detection terminal in contact with the second end of said electrode adjacent to said electrode to be inspected;

said earth section has an earth terminal in contact with said common electrode; and said current application terminal and said voltage detection terminal are shaped so as to be in point contact with said electrodes, respectively, while said earth terminal is shaped so as to be in area contact with said common electrode.

5. An electrode pattern inspection device, for detecting wire breakage and short-circuiting in electrode patterns by applying electric current thereto, said electrode patterns being formed at uniform spaces in a stripe form on a substrate, each of said electrode patterns having a plurality of electrodes with first ends connected with a common electrode formed on a peripheral part of said substrate, and second ends opposite the first ends, said electrode pattern inspection device comprising:

a constant current application terminal for applying DC constant current to an electrode to be inspected, said constant current application terminal being in contact with the second end of the electrode to be inspected;

a voltage detection terminal in contact with an electrode adjacent to said electrode to be inspected, to measure a voltage thereat;

an earth terminal connected with an earth, said earth terminal being in contact with said common electrode, thereby grounding the first ends of said plurality of electrodes;

current application means for applying DC constant current to said electrode to be inspected through said constant current application terminal and for detecting voltage variation in connection therewith;

voltage detection means for detecting variation in the voltage measured by said voltage detection terminal; and storing and identifying means for storing as defect information respective variation in the voltages detected by said current application means and said voltage detection means, for detecting wire breakage and short-circuiting occurring in said electrode patterns based on the defect information, and for identifying positions of wire breakage and short-circuiting on said electrode pattern.

6. The electrode pattern inspection device as set forth in claim 5, comprising:

scanning means for driving said constant current application terminal, said voltage detection terminal, and said earth terminal to scan in a predetermined direction, and detecting, on said substrate, a position of an electrode pattern at which variation in a voltage is detected by the scan of said terminals, wherein said storing and identifying means stores as defect information the position of said electrode pattern in addition to the variation in the voltages, and based on the defect information, detects an electrode pattern undergoing at least one of wire breakage and short-circuiting, to identify the position of said electrode pattern.

7. The electrode pattern inspection device as set forth in claim 5, wherein:

each of said constant current application terminal and said voltage detection terminal is shaped so as to be in point contact with said electrode pattern; and said earth terminal is shaped so as to be in area contact with said common electrode pattern.

8. The electrode pattern inspection device as set forth in claim 5, wherein:

let an inside resistance of said voltage detection means be $R_0$, and the voltage measured be V, and the inside resistance $R_0$ is set great so that $V/R_0$ is substantially 0.

9. The electrode pattern inspection device as set forth in claim 5, wherein the inside resistance of said voltage detection means is set substantially equal to the resistance of said electrode pattern.

10. An electrode pattern inspection method, for detecting wire breakage and short-circuiting in electrode patterns by applying electric current to an electrode to be inspected that is one of a plurality of electrodes formed at uniform spaces in a stripe form on a substrate and having first ends connected with a common electrode formed on a peripheral part of the substrate, and second ends opposite the first ends, said electrode pattern inspection method comprising:

a voltage detection step in which the common electrode is earthed, thereby grounding the first ends of the electrode to be inspected, DC constant current is applied to the second end of the electrode to be inspected, variation in a voltage is detected at the second end of an electrode adjacent to the electrode to be inspected, and variation in a voltage is detected in connection with the second end where the DC constant current is applied; and a defect detection step in which a defect such as wire breakage or short-circuiting occurring in an electrode pattern is detected, and the position on the electrode pattern is identified, based on defect information about the variation in the voltages detected and a position of the electrode pattern at which the variation in the voltages is detected, after said voltage detection step is successively applied repeatedly to the electrode patterns.

\* \* \* \* \*